United States Patent [19]
Hossain et al.

[11] Patent Number: 5,913,131
[45] Date of Patent: *Jun. 15, 1999

[54] ALTERNATIVE PROCESS FOR BPTEOS/ BPSG LAYER FORMATION

[75] Inventors: Tim Z. Hossain; Franklin D. Crawford, Jr.; Don A. Tiffin, all of Austin, Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/748,815
[22] Filed: Nov. 14, 1996
[51] Int. Cl.$^6$ .............................. H01L 21/26; H01L 21/31
[52] U.S. Cl. ......................... 438/423; 438/760; 438/783
[58] Field of Search ..................... 438/783, FOR 396, 438/423, 760, 918

[56] References Cited

U.S. PATENT DOCUMENTS

| | | | |
|---|---|---|---|
| 4,654,112 | 3/1987 | Douglas et al. | 156/643 |
| 4,732,865 | 3/1988 | Evans et al. | 437/12 |
| 5,130,552 | 7/1992 | Bright et al. | 250/492.2 |
| 5,395,783 | 3/1995 | Baumann et al. | |
| 5,429,975 | 7/1995 | Sheu et al. | 437/52 |
| 5,499,632 | 3/1996 | Hong | 437/48 |
| 5,523,597 | 6/1996 | Baumann et al. | |
| 5,656,556 | 8/1997 | Yang | 438/646 |

OTHER PUBLICATIONS

Wolf, Stanley "Silicon Processing For The VLSI Era Vol. 1: Process Technology", Lattice Press, pp. 187–191,308–311, 1986.

*Primary Examiner*—John F. Niebling
*Assistant Examiner*—Michael S. Lebentritt
*Attorney, Agent, or Firm*—Conley, Rose & Tayon; Kevin L. Daffer; Robert C. Kowert

[57] ABSTRACT

An interlevel dielectric and a method for making same wherein boron is introduced into the dielectric though an implantation process. During the implantation process, either the boron-10 or the boron-11 boron isotope may be selected and introduced into the dielectric. Boron is introduced to make the dielectric flow at lower temperatures. Selectively implanting boron-10 or boron-11 during implantation, as opposed to buying boron comprising a specific boron isotope from a supplier and introducing boron during CVD, lowers the production costs. Furthermore, by introducing boron into the dielectric during the implantation process as opposed to during deposition of the dielectric during a CVD process, the dielectric layer is free of boron bumps. Boron-bearing dielectrics can be made to made to flow at lower temperatures than dielectrics which do not contain boron. Furthermore, boron-11 can be introduced exclusively into the dielectric during the implantation process to eliminate soft errors caused by the formation of alpha particles. Boron-10 is a major source of alpha particles formed in a nuclear reaction between boron-10 and cosmic ray neutrons.

26 Claims, 2 Drawing Sheets

ALTERNATIVE PROCESS FOR BPTEOS/BPSG LAYER FORMATION

BACKGROUND OF THE INVENTION

1. Field of the Invention

This invention relates to the field of semiconductor processing and, more particularly, to an alternative method for forming an interlevel dielectric comprising borophosphosilicate glass or boro-phospho-tetra-ethyl-ortho-silicate using boron implantation.

2. Description of Relevant Art

It is well known that alpha particles are very harmful to the operation of semiconductor devices and, more particularly, semiconductor devices that are charge-sensitive. Such devices may include dynamic random access memories ("DRAMs"), charge-coupled devices ("CCDs"), and static random access memories ("SRAMs"). An alpha particle comprises a high energy, positively charged helium nucleus. As the alpha particle travels through the device, the amount of charge present in the device changes. In the case of a memory device, this may mean changing the charge enough to the point of changing the status of the device. Such errors caused by alpha particles are generally referred to as soft errors. Therefore, limiting the production of alpha particles is essential in ensuring reliable charge-sensitive devices.

A major alpha particle source is boron-10, one of the two stable isotopes of boron. Naturally existing boron comprises 20% boron-10 and 80% boron-11. An alpha particle is created when a cosmic ray neutron strikes a boron-10 nucleus to produce a lithium-7 atom and a high energy alpha particle. That is:

$$^{10}B + {}^1n \rightarrow {}^7Li + {}^4\alpha.$$

Boron-10 has a thermal neutron cross-section of 3838 barns ($3.838 \times 10^{-21}$ cm$^2$); most elements have a thermal neutron cross-section of about $10^{-3}$ barns ($10^{-27}$ cm$^2$). Therefore, the probability that a boron-10 nucleus will absorb a cosmic neutron and emit a high-energy alpha particle is very high.

One way to overcome soft error problems associated with boron-10 is to avoid using it in device processing. Boron may be purchased as pure boron-11 from a supplier and can be used in all process applications in the place of the naturally occurring mixed boron. Purchasing pure boron-11, as opposed to naturally occurring boron, increases production costs. Since boron-11 and boron-10 have identical chemical properties, using pure boron-11 during processing should have no effect on device performance. Boron is used throughout modern semiconductor devices including source regions, drain regions, gate structures, and interlevel dielectrics. Boron concentration in interlevel dielectrics is much higher than boron concentrations in the source regions, the drain regions, and the gate structure. Therefore, the interlevel dielectric is the most critical area for reducing the presence of boron-10.

Borophosphosilicate glass ("BPSG") is used as an interlevel dielectric to provide insulation between the overlying metal layer and the underlying polysilicon gates, source regions, and drain regions. BPSG is formed in a single-step process using chemical-vapor deposition ("CVD"). A layer of silicon nitride is sometimes first formed upon the device to protect the polysilicon, source and drain regions, and the salicides from dopants inside the interlevel dielectrics. An interlevel dielectric needs to have good flow characteristics so that it can fill in gaps over the semiconductor substrate and give rise to a fairly planar upper surface. After deposition, the wafer is heated and the interlevel dielectric flows to fill in existing gaps and become planar. In addition, the heat treatment helps activate source and drain implants. An interlevel dielectric must also have good reflow properties. After contact holes are etched into the interlevel dielectric for subsequent metal deposition, the interlevel dielectric is heated which causes it to reflow. Consequently, the previously vertical sidewalls of the holes are now sloping, and the previously sharp corners are now smooth. This smoothing aids subsequent metal deposition by allowing the metal to reach the underlying silicon more easily and without creating voids. BPSG is a ternary (three-component) glass, made out of $B_2O_3$—$P_2O_5$—$SiO_2$. Phosphorus is added to the dielectric to reduce stress and, to a lesser degree, improve step coverage. A concentration of at least 6 wt % phosphorus is needed for the dielectric to flow. Also, the addition of phosphorus makes the interlevel dielectric an excellent getter of sodium atoms. Sodium contamination can cause instability with the threshold voltage. Boron is added to make the glass flow at lower temperatures. Making the glass flow at lower temperatures helps conserve the thermal budget. The more boron added the more flowable the glass is. However, boron concentrations above 5 wt % make the glass unstable. BPSG with approximately 5 wt % phosphorus and 5 wt % boron concentrations can be made to flow around 800° C. or less, much lower than temperatures needed for undoped glass. Adding boron to the BPSG during the CVD process produces an upper surface of the BPSG with "boron bumps". An extra step for removing the bumps is then required. A mechanical scrubbing process is preferably used to remove the bumps and planarize the upper surface of the interlevel dielectric. The extra processing step decreases throughput and increases production costs.

Boron is essential in making interlevel dielectrics able to flow at approximately 800° C. or less. Furthermore, if boron-11 is used exclusively, soft errors are substantially eliminated since production of alpha particles is minimized. Therefore, it would be desirable to be able to form a boron-bearing interlevel dielectric which is free of "boron bumps" on the upper surface of the interlevel dielectric. Furthermore, it would be desirable to be able to introduce boron-10 or boron-11 into the dielectric without having to purchase boron in either pure boron-10 or pure boron-11 form from a supplier. Separation of boron into its isotopes during the production process would significantly reduce production costs.

SUMMARY OF THE INVENTION

The problems identified above are in large part addressed by an interlevel dielectric and a method for making same where boron is introduced into the dielectric through an implantation process. During the implantation process, one of boron's two isotopes (boron-10 or boron-11) may be selected and introduced into the dielectric. Boron is introduced to make the dielectric flow at lower temperatures. Selectively implanting boron-10 or boron-11 during implantation, as opposed to buying boron comprising a specific boron isotope from a supplier and introducing boron during the CVD process, significantly lowers production costs. Furthermore, introducing boron into the dielectric during the implantation process produces a dielectric layer with an upper surface which is free of boron bumps. Boron-bearing dielectrics can be made to flow at lower temperatures than dielectrics which do not contain boron. Furthermore, boron-11 can be exclusively introduced into the dielectric during the implantation process to eliminate soft errors caused by the formation of alpha particles. Boron-10 is a major source of alpha particles formed in a nuclear reaction between boron-10 and cosmic ray neutrons.

A semiconductor substrate is first provided upon which a device is formed. An interlevel dielectric is then deposited upon the semiconductor substrate and the device. The interlevel dielectric provides electrical insulation between the underlying device and the, subsequently formed, overlying metal. Either phosphosilicate glass or TEOS containing phosphorus is deposited using a CVD process. The phosphorus is introduced during the CVD process such that the dielectric has a phosphorus concentration of approximately 6 wt %. Subsequently, boron is introduced using an ion implantation process. Boron-10 or boron-11, the two isotopes of boron, can be selectively introduced into the dielectric to a concentration of approximately 5 wt %. Implanting boron, as opposed to introducing boron during the CVD process, forms an upper surface of the dielectric which is free of boron bumps. The introduction of boron makes the dielectric flow at approximately 800° C. or less, much lower than dielectrics without boron doping.

BRIEF DESCRIPTION OF THE DRAWINGS

Other objects and advantages of the invention will become apparent upon reading the following detailed description and upon reference to the accompanying drawings in which:

FIG. 1b is an expanded view along plane A of FIG. 7a showing the upper surface of the interlevel dielectric in detail;

FIG. 6b is an expanded view along plane B of FIG. 6a showing the upper surface of the interlevel dielectric in detail.

Figure 1A:
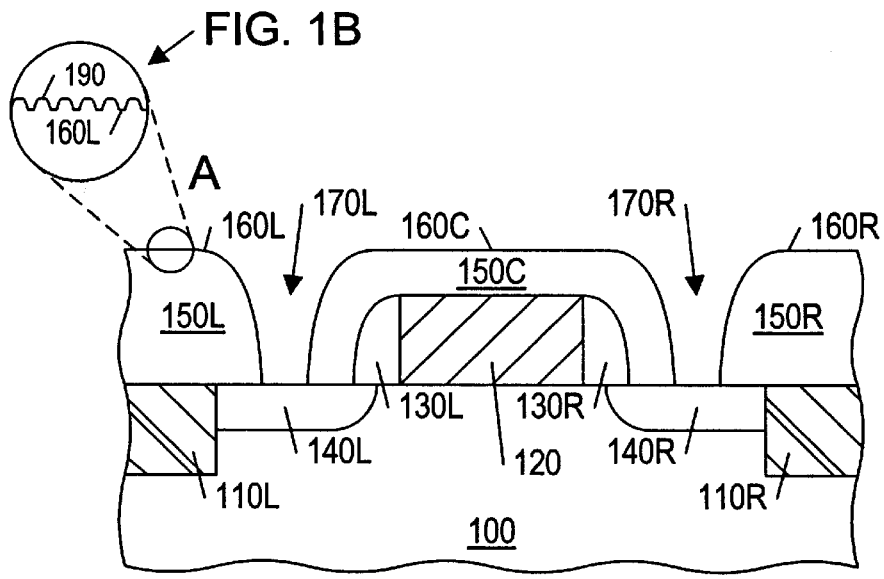
FIG. 1a is a partial cross-sectional view of a semiconductor substrate used to describe prior art showing a BPSG interlayer dielectric with boron bumps shown on the upper surface of the BPSG.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but, on the contrary, the intention is to cover all modifications, equivalents, and alternatives falling within the spirit and scope of the present invention as defined by the appended claims.

DETAILED DESCRIPTION OF THE INVENTION

Turning now to the drawings, FIG. 1a is used to describe prior art. Semiconductor substrate 100 is shown with a transistor laterally displaced between first isolation structure 110L and second isolation structure 110R. The transistor comprises conductive gate structure 120, source and drain regions 140L and 140R, and protective spacers 130L and 130R. Interlevel dielectric layer 150, preferably comprising BPSG or BPTEOS, is deposited over the transistor and semiconductor substrate 100 with a CVD process. FIG. 1b is an expanded view along plane A of FIG. 1a showing the formation of boron bumps 190 on upper surface 160 of interlevel dielectric 150. Boron bumps 190 are due to the presence of boron in interlevel dielectric 150 introduced during the CVD process. Boron bumps 190 can be removed by mechanical scrubbing. The removal of boron bumps 190 is an additional processing step which increases the total manufacturing cost.

Figure 2:
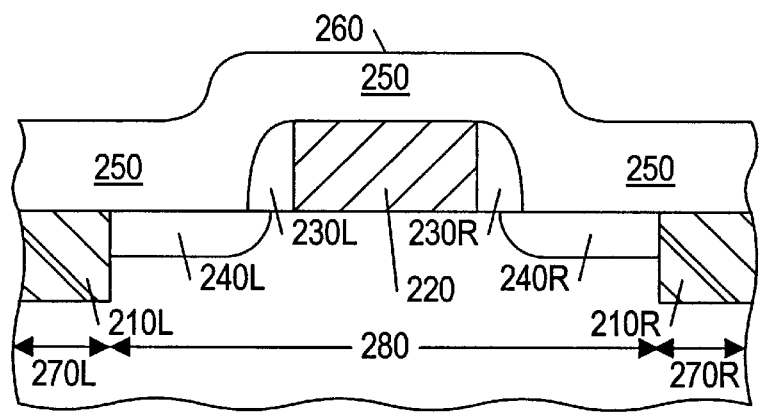
FIG. 2 is a partial cross-sectional view of a semiconductor substrate, in which a device is formed upon the semiconductor substrate, and an interlevel dielectric layer is deposited upon the device and the semiconductor substrate using CVD.

Turning now to FIG. 2, semiconductor substrate 200 is provided. Semiconductor substrate 200 preferably comprises lightly doped n-type or p-type silicon with a resistivity of approximately 12 Ω-cm. Isolation structures 210L and 210R are formed in field regions 270L and 270R of semiconductor substrate 200. Isolation structures 210L and 210R preferably comprise shallow trench isolation structures. Alternatively, isolation structures 210L and 210R may comprise local oxidation of silicon ("LOCOS") structures. A device is then formed in active region 280 of semiconductor substrate 200. In one embodiment, the device comprises a field-effect transistor. The field-effect transistor comprises conductive gate structure 220, source and drain regions 240L and 240R, and protective spacers 230L and 230R. Conductive gate structure 220 preferably comprises polycrystalline silicon ("polysilicon") doped p-type or n-type such that the polysilicon has a sheet resistivity of less than approximately 500 Ω/sq. Source and drain regions 240L and 240R are doped n-type or p-type, preferably through an ion implantation process, so that a peak impurity concentration in source and drain regions 240L and 240R is approximately $10^{19}$ atoms/cm$^3$.

After the transistor is formed, interlevel dielectric 250 is deposited using a CVD process upon the device and semiconductor substrate 200. Interlevel dielectric 250 is deposited to electrically insulate the device from a subsequently deposited, overlying metal layer. In a preferred embodiment, interlevel dielectric 250 comprises phosphosilicate glass ("PSG"). PSG is a binary glass consisting of $P_2O_5$—$SiO_2$. Phosphorus is added to the glass during deposition to a concentration of at least 6 wt %. Phosphorus is added to the dielectric to reduce stress and, to a lesser degree, improve step coverage. A concentration of at least 6 wt % phosphorus is needed for the dielectric to flow. The addition of phosphorus also makes the interlevel dielectric an excellent getter of sodium atoms which can cause instability with the threshold voltage. In an alternative embodiment, interlevel dielectric 250 comprises phosphorus-doped TEOS.

Figure 3:
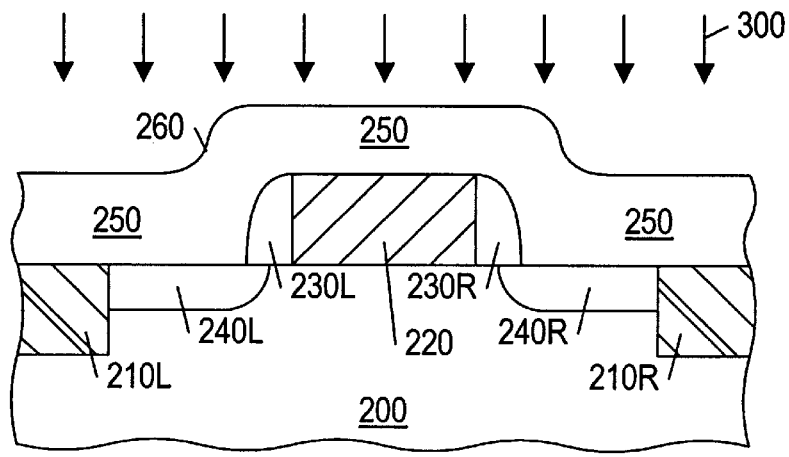
FIG. 3 is a subsequent processing step to FIG. 2 in which a high dose of boron is implanted into the interlevel dielectric layer.

Turning now to FIG. 3, boron 300 is implanted into interlevel dielectric 250. Boron can occur in two stable isotopes: boron-10 and boron-11. Naturally occurring boron comprises 20% boron-10 and 80% boron-11. The two isotopes are chemically identical but have different masses (boron-10 has atomic mass 10 and boron-11 has atomic mass 11). Because of their difference in mass, boron-10 and boron-11 can be separated during the boron implantation. Boron, in the form of $BF_3$, is fed into the ion source which ionizes the gas and produces a plasma at pressures of approximately $10^{-3}$ torr. Subsequently, the plasma is extracted, focused into a beam, and passed through an analyzing device which selects only the ion species of interest according to their mass and rejects all others. The separation is performed with an analyzing magnet, as the radius of the arc of a charged particle traveling through a magnetic field perpendicular to the direction of motion depends on the mass of the ion. After going through the magnetic field, the beam passes through a resolving aperture positioned so that only ions of particular atomic mass go through. The beam now contains approximately 99% of the selected ion. Therefore, either boron-10 or boron-11 can be selected during implantation. Being able to choose between the two different isotopes is very useful. For example, the presence of boron-10 can be very harmful for charge-sensitive semiconductor devices. Such devices include dynamic random access memories ("DRAMs"), charge-coupled devices ("CCDs"), and static random access memories ("SRAMs"). Boron-10 is associated with the creation of alpha particles which give rise to the so called soft errors. An alpha particle comprises a high energy, positively charged helium nucleus. As it travels through the device, the high energy, charged alpha particle changes the amount of charge present in the device. In the case of a memory device, this may mean changing the charge enough to the point of changing the status of the device. Therefore, limiting the production of alpha particles is essential in ensuring reliable charge-sensitive devices. An alpha particle is created when a cosmic ray neutron strikes a boron-10 nucleus to produce a lithium-7 atom and a high energy alpha particle. That is:

$$^{10}B + ^1n \rightarrow ^7Li + ^4\alpha.$$

Boron-10 has a thermal neutron cross-section of 3838 barns ($3.838 \times 10^{-21}$ cm$^2$); most elements have a thermal neutron cross-section of about $10^{-3}$ barns ($10^{-27}$ cm$^2$). Therefore, the probability that a boron-10 nucleus will absorb a cosmic neutron and emit a high-energy alpha particle is very high. The higher the boron concentration the more flowable the glass is. However, boron concentrations above 5 wt % make the glass unstable. BPSG with approximately 5 wt % phosphorus and 5 wt % boron concentrations can be made to flow at 800° C. or less; much lower than undoped glass.

Figure 4:
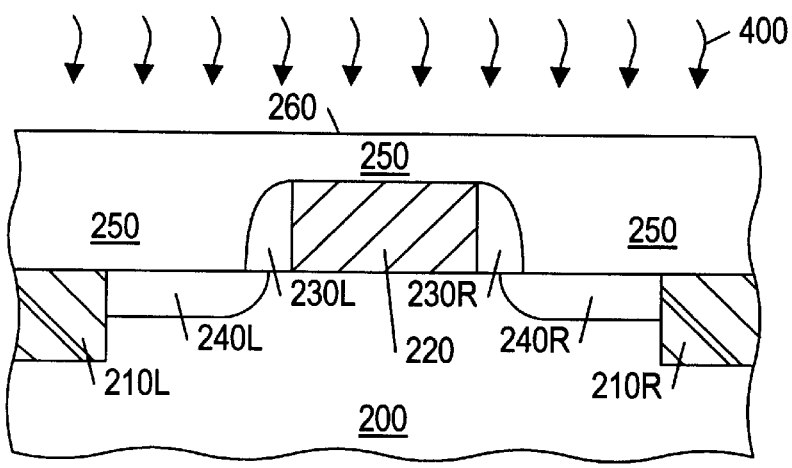
FIG. 4 is a sub sequent processing step to FIG. 3 in which heat is applied to the interlevel dielectric layer which flows and becomes planar.

Turning now to FIG. 4, semiconductor substrate 200 is heated at a temperature of approximately 800° C. or less. Interlevel dielectric 250 flows to form a planar upper surface 260. Performing this in steam ambient further increases the flowing properties of interlevel dielectric 250. The higher the boron concentration in the interlevel dielectric 250, the lower the temperatures required to make interlevel dielectric 250 flow. An increase in boron concentration of 1 wt % in BPSG decreases the required flow temperatures by approximately 40° C.

Figure 5:
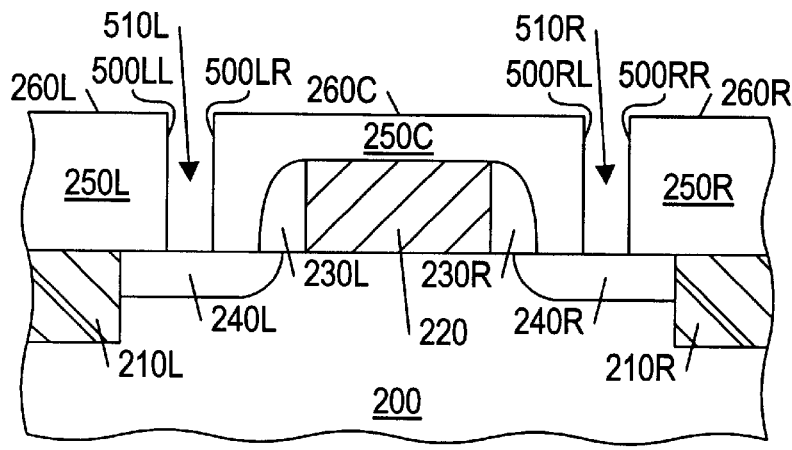
FIG. 5 is a subsequent processing step to FIG. 4 in which a contact hole is etched in the interlevel dielectric down to the source and drain regions.

Turning now to FIG. 5, contact holes 510L and 510R are etched in the interlevel dielectric 250. The etching can be done using either wet or dry anisotropic etching techniques. Contact holes 510L and 510R are etched for the formation of electrical contacts between source and drain regions 240L and 240R and the subsequently deposited, overlying metal layer. Hole sidewalls 500 are substantially vertical following the anisotropic etch process.

Figure 6A:
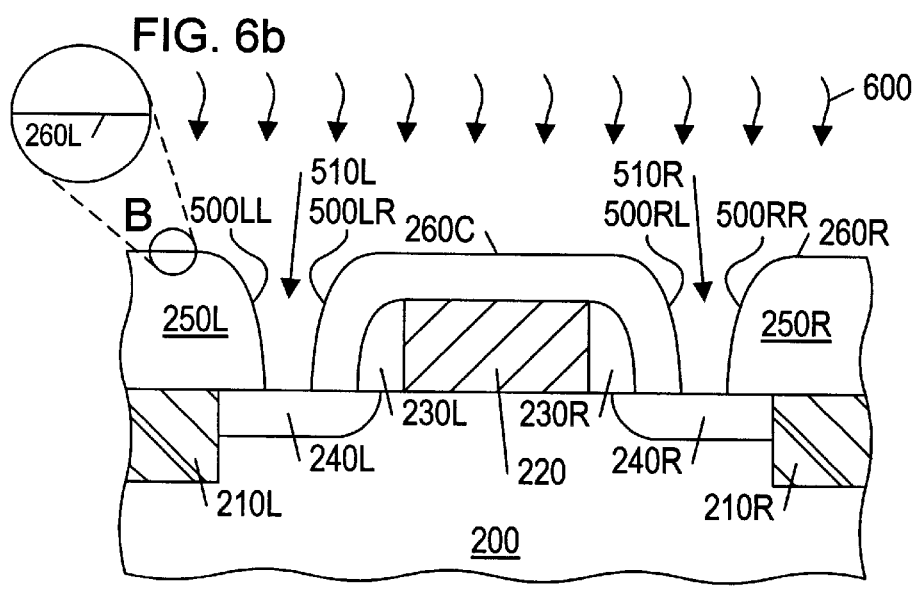
FIG. 6a is a subsequent processing step to FIG. 5 in which heat is applied to the interlevel dielectric layer which reflows to produce smooth contact hole sidewalls.

Turning now to FIG. 6a, a second thermal process is applied to semiconductor substrate 200. Following anisotropic etching, contact holes 510 have sharp upper corners which makes contact holes 510 difficult to fill with metal. A second thermal flow rounds these sharp corners and gives rise to sloping contact hole sidewalls 500. Contact coverage by the subsequent metal film is significantly improved. The ambient is usually inert, rather than oxidizing, in order to avoid silicon dioxide growth at the contacts during the reflow step. FIG. 6b is an expanded view along plane B of FIG. 6a, in which upper surface 260 of interlevel dielectric 250 is shown. Upper surface 260 is shown to be smooth and free of boron bumps. Boron bumps are only formed when boron is introduced into interlevel dielectric 250 during a CVD process. If boron is implanted instead, upper surface 260 is free of boron bumps and the extra step of mechanically scrubbing the boron bumps is now eliminated.

It will be appreciated to those skilled in the art having the benefit of this disclosure that this invention is capable of forming an interlevel dielectric by first depositing a layer of the interlevel dielectric and then selectively implanting boron-10 or boron-11 so as to decrease production costs and avoid "boron" bump formation. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A process for forming an interlevel dielectric layer comprising:

providing a semiconductor substrate;

forming a device upon said semiconductor substrate;

forming a TEOS dielectric layer upon said device and said semiconductor substrate; and implanting boron into said TEOS dielectric layer.

2. The process as recited in claim 1, further comprising:

heating said TEOS dielectric layer to a temperature sufficient to cause said TEOS dielectric layer to flow such that a planar upper surface is formed on said TEOS dielectric layer, wherein said planar upper surface is free of boron bumps;

etching contact holes in said TEOS dielectric layer; and reflowing said TEOS dielectric layer such that corners of said contact holes are rounded.

3. The process as recited in claim 1, wherein forming said TEOS dielectric layer comprises depositing TEOS using a CVD process.

4. The process as recited in claim 1, wherein forming said TEOS dielectric layer comprises:

depositing TEOS; and adding phosphorous to said TEOS dielectric layer at a concentration of substantially not less than approximately 6 wt %.

5. The process as recited in claim 1, wherein said implanting boron comprises implanting substantially only one type of boron isotope and wherein said only one type of boron isotope is selected from the group consisting of boron-10 and boron-11.

6. The process as recited in claim 1, further comprising heating said TEOS dielectric layer to a temperature sufficient to cause said TEOS dielectric layer to flow such that a planar upper surface is formed on said TEOS dielectric layer.

7. The process as recited in claim 1, further comprising:

etching contact holes in said TEOS dielectric layer; and reflowing said TEOS dielectric layer such that corners of said contact holes are rounded, wherein said planar upper surface is free of boron bumps.

8. The process as recited in claim 1, wherein said implanting boron comprises implanting only boron-11 such that an upper surface of said TEOS dielectric layer is free of boron bumps.

9. The process as recited in claim 1, wherein said implanting boron into said TEOS dielectric comprises:
  ionizing a boron-containing compound to produce a plasma comprising ion species;
  focusing said plasma into a beam;
  passing said beam through an analyzing device which separates said ion species based on an atomic mass of each of said ion species; and
  implanting only one of said ion species.

10. The process as recited in claim 9, wherein the boron-containing compound is $BF_3$.

11. The process as recited in claim 9, wherein said plasma is produced at pressures of approximately $10^{-3}$ torr.

12. The process as recited in claim 1, wherein said implanting comprises implanting said boron into said TEOS dielectric layer up to a concentration of approximately 5 wt %.

13. A process for forming an interlevel dielectric layer comprising:
  providing a semiconductor substrate;
  forming a device upon said semiconductor substrate;
  forming a TEOS dielectric layer upon said device and said semiconductor substrate;
  implanting only one type of boron isotope into said TEOS dielectric layer;
  heating said TEOS dielectric layer to a temperature sufficient to cause said TEOS dielectric layer to flow such that a planar upper surface is formed on said TEOS dielectric layer;
  etching contact holes in said TEOS dielectric layer; and
  reflowing said TEOS dielectric layer such that corners of said contact holes are rounded;
  wherein said planar upper surface is free of boron bumps.

14. The process as recited in claim 13, wherein forming said TEOS dielectric layer comprises depositing TEOS using a CVD process.

15. The process as recited in claim 13, wherein forming said TEOS dielectric layer comprises:
  depositing TEOS; and
  adding phosphorous to said TEOS dielectric layer at a concentration of substantially not less than approximately 6 wt %.

16. The process as recited in claim 13, wherein said only one type of boron isotope is selected from the group consisting of boron-10 and boron-11.

17. The process as recited in claim 13, wherein said implanting only one type of boron isotope into said TEOS dielectric comprises:
  ionizing a boron-containing compound to produce a plasma comprising ion species;
  focusing said plasma into a beam;
  passing said beam through an analyzing device which separates said ion species based on an atomic mass of each of said ion species; and
  implanting only one of said ion species.

18. The process as recited in claim 17, wherein the boron-containing compound is $BF_3$.

19. The process as recited in claim 17, wherein said plasma is produced at pressures of approximately $10^{-3}$ torr.

20. The process as recited in claim 13, wherein said implanting comprises implanting said only one isotope of boron into said TEOS dielectric layer up to a concentration of approximately 5 wt %.

21. A process for forming an interlevel dielectric layer comprising:
  providing a semiconductor substrate;
  forming a device upon said semiconductor substrate;
  forming an interlevel dielectric layer upon said device and said semiconductor substrate;
  implanting boron into said interlevel dielectric layer; and
  forming a contact hole in said interlevel dielectric layer.

22. The process as recited in claim 21, wherein said forming an interlevel dielectric layer comprises depositing a material selected from the group consisting of silicate glass and TEOS using a CVD process.

23. The process as recited in claim 22, further comprising adding phosphorus to said interlevel dielectric layer during said CVD process to a concentration of approximately 6 wt %.

24. The process as recited in claim 21, wherein said implanting boron comprises implanting only one type of boron isotopes selected from the group consisting of boron-10 and boron-11.

25. The process as recited in claim 21, wherein said implanting boron comprises implanting enough boron so that said interlevel dielectric layer flows at a temperature of approximately 800° C. or less, and wherein an upper surface of said interlevel dielectric layer is free of boron bumps.

26. The process as recited in claim 21, wherein said implanting boron comprises implanting boron-11 isotopes only, such that said interlevel dielectric layer flows at a temperature of approximately 800° C. or less, and such that an upper surface of said interlevel dielectric layer is free of boron bumps.

* * * * *